(12) United States Patent
Hasebe et al.

(10) Patent No.: US 8,141,570 B2
(45) Date of Patent: Mar. 27, 2012

(54) SYSTEM AND METHOD FOR REMOVING FOREIGN PARTICLES FROM SEMICONDUCTOR DEVICE

(75) Inventors: Yuta Hasebe, Obu (JP); Hiroshi Tanaka, Toyokawa (JP); Masanobu Azukawa, Anjo (JP); Junichi Tanaka, Nukata-gun (JP); Tadashi Kobayashi, Nagoya (JP); Kenta Iwahana, Okazaki (JP)

(73) Assignee: DENSO CORPORATION, Kariya (JP)

( * ) Notice: Subject to any disclaimer, the term of this patent is extended or adjusted under 35 U.S.C. 154(b) by 901 days.

(21) Appl. No.: 11/709,296

(22) Filed: Feb. 22, 2007

(65) Prior Publication Data

US 2007/0199580 A1 Aug. 30, 2007

(30) Foreign Application Priority Data

Feb. 27, 2006 (JP) .................................. 2006-49540

(51) Int. Cl.
*B08B 3/00* (2006.01)
(52) U.S. Cl. ........................... 134/184; 15/308; 134/157
(58) Field of Classification Search ........................ None
See application file for complete search history.

(56) References Cited

U.S. PATENT DOCUMENTS

| | | | |
|---|---|---|---|
| 5,618,759 A | 4/1997 | Boysel | |
| 6,992,026 B2 | 1/2006 | Fukuyo et al. | |
| 2005/0025640 A1* | 2/2005 | Sekiguchi et al. | 417/423.4 |
| 2005/0173387 A1 | 8/2005 | Fukuyo et al. | |
| 2005/0181581 A1 | 8/2005 | Fukuyo et al. | |
| 2005/0184037 A1 | 8/2005 | Fukuyo et al. | |
| 2005/0189330 A1 | 9/2005 | Fukuyo et al. | |
| 2005/0194364 A1 | 9/2005 | Fukuyo et al. | |
| 2006/0040473 A1 | 2/2006 | Fukuyo et al. | |
| 2006/0160331 A1 | 7/2006 | Fukuyo et al. | |

FOREIGN PATENT DOCUMENTS

| | | |
|---|---|---|
| JP | A-61-172337 | 8/1986 |
| JP | A-02-237028 | 9/1990 |
| JP | A-4-129208 | 4/1992 |
| JP | A-4-306834 | 10/1992 |
| JP | A-6-99151 | 4/1994 |
| JP | 07-144181 A | 6/1995 |
| JP | B2-2814757 | 8/1998 |
| JP | 11-236015 A | 8/1999 |
| JP | B2-2976542 | 9/1999 |
| JP | 2000254480 A * | 9/2000 |
| JP | A-2004-249210 | 9/2004 |
| JP | 2004-330055 A | 11/2004 |

OTHER PUBLICATIONS

Office Action dated Oct. 22, 2008 in corresponding German patent application No. 10 2007 008 223.3-43 (and English translation).
Notice of Reasons for Refusal mailed on Jun. 22, 2010 issued from the Japanese Patent Office in the corresponding Japanese patent application No. 2006-049540 (and English translation).
Office Action mailed on Oct. 14, 2010 issued from the German Patent Office in corresponding German patent application No. 10 2007 008 223.3 (and English translation).

* cited by examiner

*Primary Examiner* — Michael Kornakov
*Assistant Examiner* — Eric Golightly
(74) *Attorney, Agent, or Firm* — Posz Law Group, PLC (57) ABSTRACT

A vibration device separates foreign particles from a semiconductor device, and a suction interface of a suction device covers an opening portion of the semiconductor device. A space connected with a vacuum passage and a communication passage is formed between the semiconductor device and the suction interface. The suction device suctions the space, and fresh air is introduced into the space through the communication passage. As a result, a current of air is generated from the communication passage to the vacuum passage, and foreign particles are suctioned and removed from the space.

1 Claim, 7 Drawing Sheets

SYSTEM AND METHOD FOR REMOVING FOREIGN PARTICLES FROM SEMICONDUCTOR DEVICE

CROSS REFERENCE TO RELATED APPLICATION

This application is based on and incorporates herein by reference Japanese Patent Application No. 2006-49540 filed on Feb. 27, 2006.

BACKGROUND OF THE INVENTION

1. Field of the Invention

This invention relates a system and method for removing foreign particles from a semiconductor device during a semiconductor device manufacturing process.

2. Description of Related Art

As disclosed in, for example, JP-A-2003-10992, one method of removing foreign particles such as dust particles that become adhered to a semiconductor device during a dicing process involves spraying a gas such as air onto the device. JP-A-Hei 04-129208 discloses another particle removal method in which foreign particles adhered to a semiconductor device are vacuumed and removed from the device by spraying gas on the device while at the same time vibrating the semiconductor device.

However, in the above methods, the foreign particles tend to scatter circumferentially when the gas is sprayed on the semiconductor device. As a result, other semiconductor processing equipment becomes polluted by the foreign particles. In addition, when plural semiconductor devices are simultaneously processed, the foreign particles removed from one semiconductor device tend to pollute other clean semiconductor devices.

The above methods therefore require a significant amount of time to be spent in cleaning the processing equipment or in predisposing the polluted semiconductor devices that needed to be cleaned.

In the above discussed method in which gas is sprayed on the semiconductor device at the same time as the semiconductor device is vibrated, the semiconductor device is covered directly with a cover so that the removed foreign particles are not scattered.

However, the vibration of the semiconductor device causes the semiconductor device to rub the cover and therefore possibly generate additional dust. It is thus necessary for such a cover to cover the entire platform on which the semiconductor device is mounted. As this method requires both a device for spraying gas on the semiconductor device and a device for removing the foreign particles, cost is added to the overall manufacturing process.

SUMMARY OF THE INVENTION

In view of the above, one object of the present invention is to provide a system and method for effectively removing foreign particles from a semiconductor device.

According to one exemplary embodiment, a system for removing foreign particles from a semiconductor device includes a vibrating device for holding and vibrating the semiconductor device, a suction device for suctioning foreign particles from the semiconductor device and having a communication passage connected to an outside fresh air source, and a vacuum passage connected to an exhaust pump. The suction device together with the semiconductor device defines a space that is in communication with the communication passage and the vacuum passage. The suction device is for generating a current of air from the communication passage to the vacuum passage to remove the foreign particles in the space.

DETAILED DESCRIPTION

Exemplary embodiments of a system and method for removing foreign particles from a semiconductor device will be described with reference to the appended claims and drawings, all of which form part of this application. In the drawings, identical portions or corresponding portions are identified with the same numerals to eliminate redundant explanation.

Figure 1:
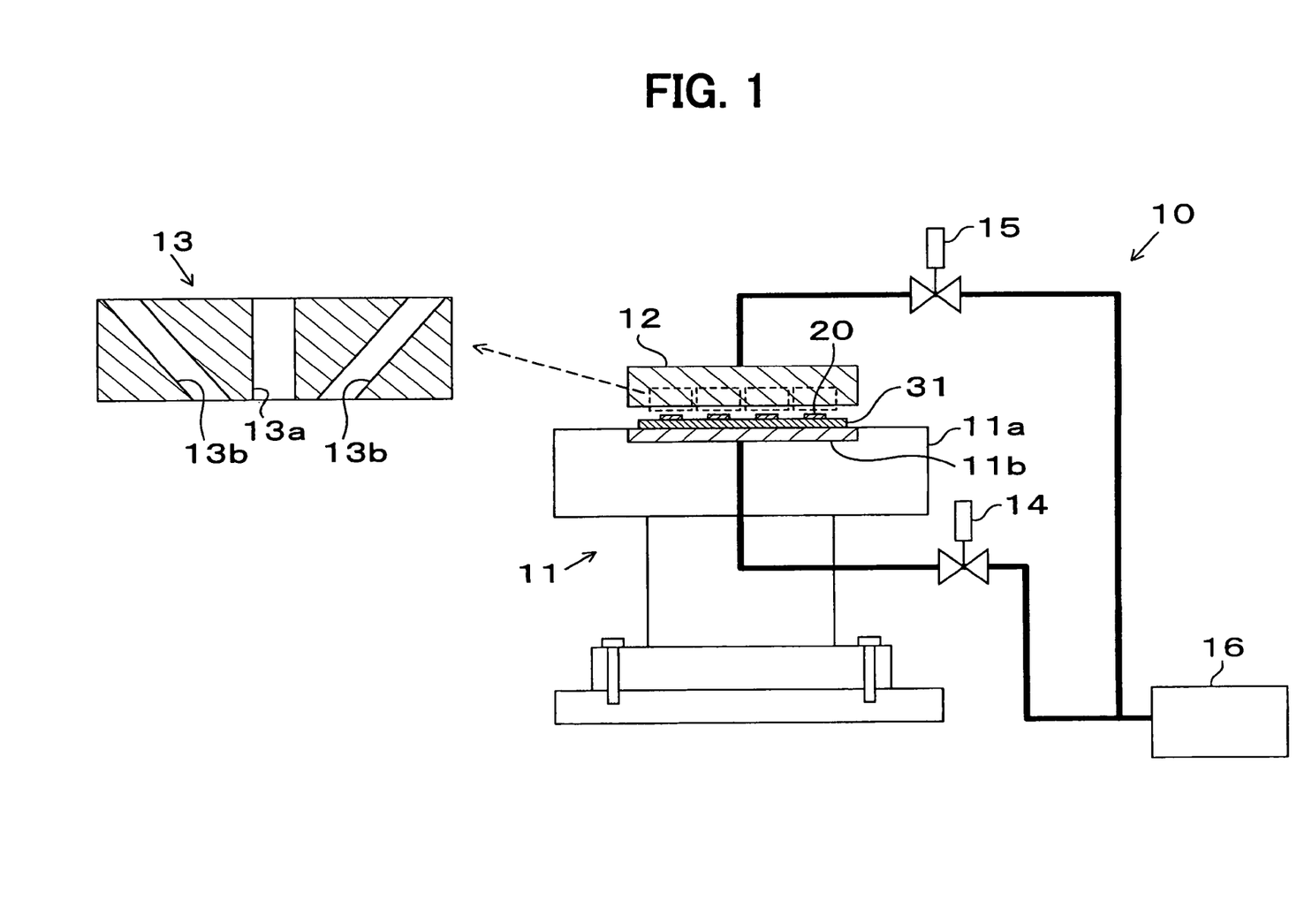
FIG. 1 is an illustration of semiconductor device manufacturing equipment including a foreign particle removal system according to an exemplary embodiment.

As shown in FIG. 1, a system for removing foreign particles (hereinafter "system") according to an exemplary embodiment is shown at 10. The present exemplary embodiment will be described as removing foreign particles adhered to a semiconductor acceleration sensor (a G sensor; hereinafter referred to as "sensor") in a ceramic package. The system 10 includes a vibration device 11 and a suction device 12. The vibration device 11 operates during a system vibration mode to vibrate plural semiconductor devices (hereinafter "devices"), such as the devices shown at 20. The suction device 12 covers the respective opened parts of the semiconductor devices 20 and suctions foreign particles adhered to the surfaces of the semiconductor devices 20 during a system suction mode.

Figure 3:
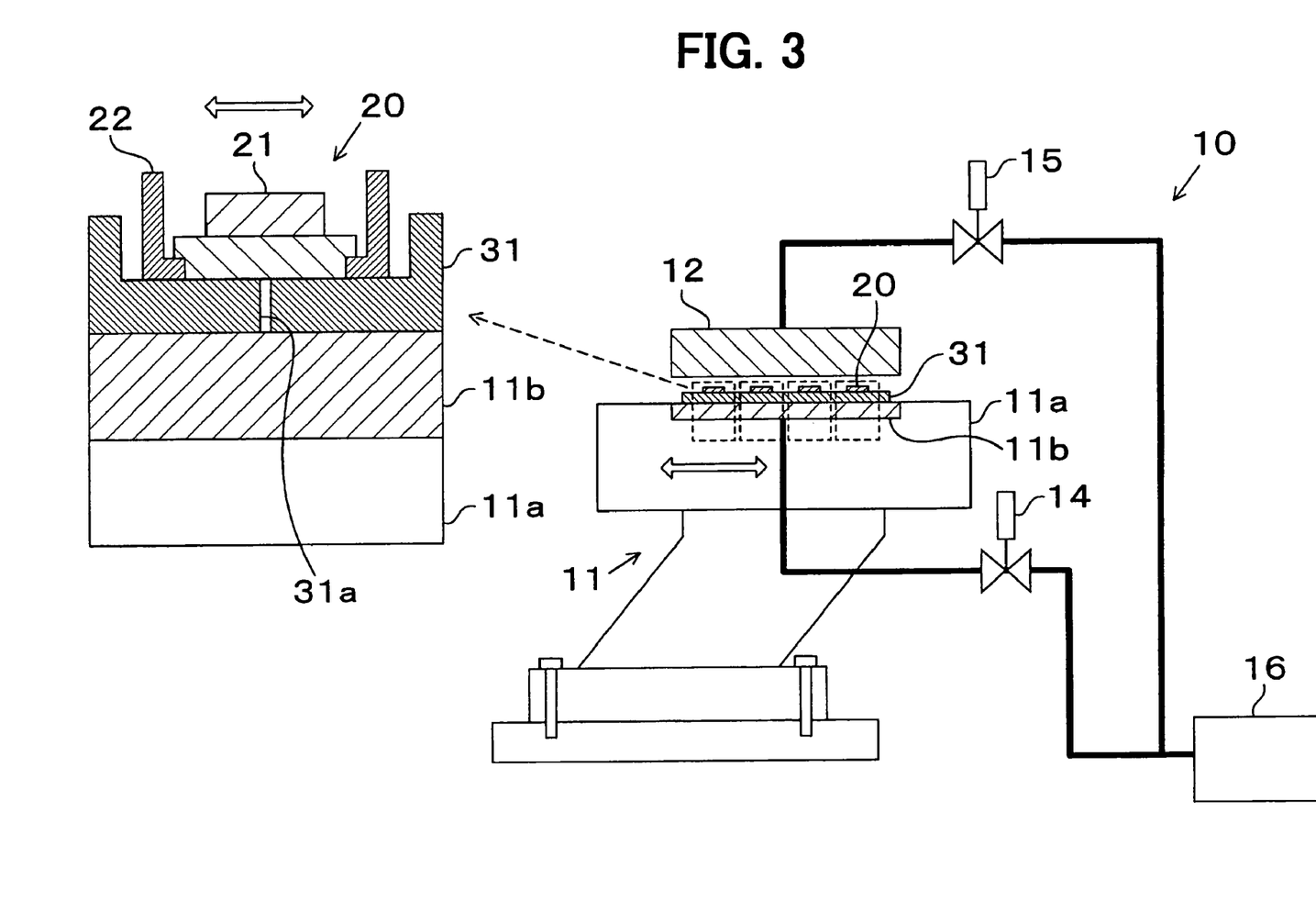
FIG. 3 shows operation of the foreign particle removal system during a vibration mode.

As shown in FIGS. 1 and 3, the vibration device 11 includes a vibration table 11a, a transportation carrier 31 and a vacuum chuck 11b. The vibration table 11a vibrates the plural semiconductor devices 20 by vibrating the transportation carrier 31. The transportation carrier 31 and the semiconductor devices 20 are affixed to the vibration table 11a by the vacuum chuck 11b. The vacuum chuck 11b is connected to an exhaust pump 16 through a vacuum chuck valve 14.

In the present exemplary embodiment, the suction device 12 includes four suction interfaces shown generally at 13. Each suction interface 13 includes a central vacuum passage 13a and communication passages 13b, 13b. The vacuum passage 13a is connected to the exhaust pump 16 through a suction valve 15. The communication passages 13b, 13b are connected to an external air source.

Here, the communication passages 13b, 13b are formed on either side of the vacuum passage 13a. Each of the communication passages 13b, 13b slants downwardly toward a lower opening of the vacuum passage 13a.

Figure 5:
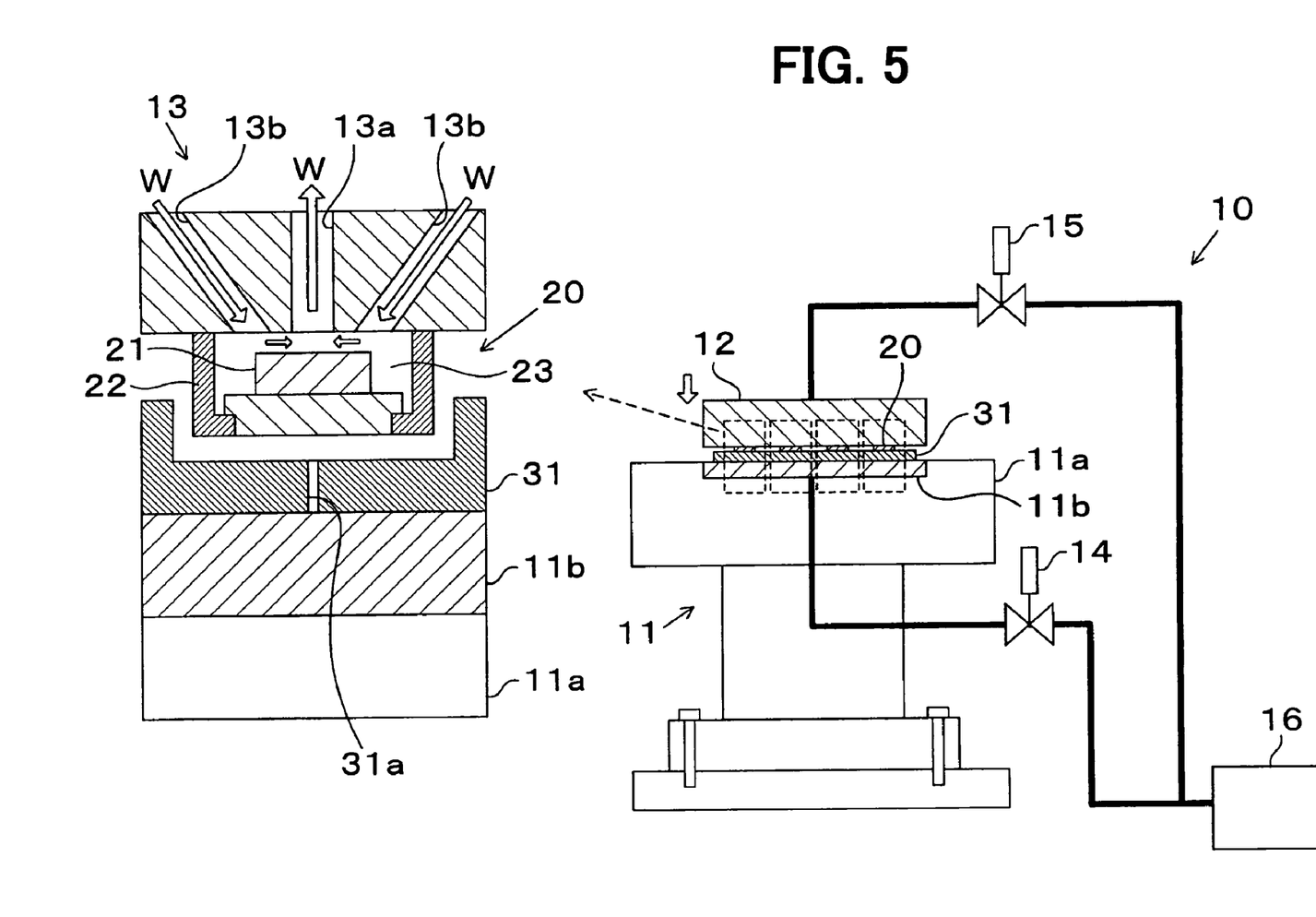
FIG. 5 shows operation of the foreign particle removal system during a suction mode.

Furthermore, each of the communication passages 13b, 13b is formed at a position and at an angle where a main current of air W (as shown in FIG. 5) described below does not directly impinge upon a central portion of an acceleration part 21 included on each of the semiconductor devices 20.

Figure 7A:
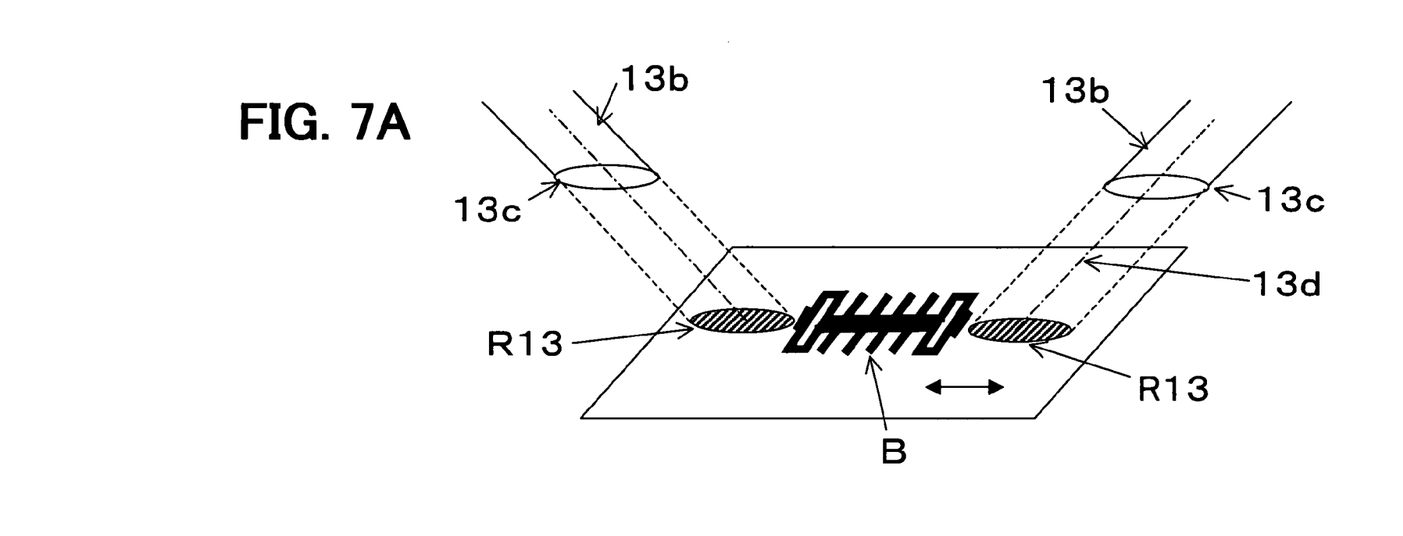
FIGS. 7A and 7B show schematic view showing a position of the communication hole.
Figure 7B:
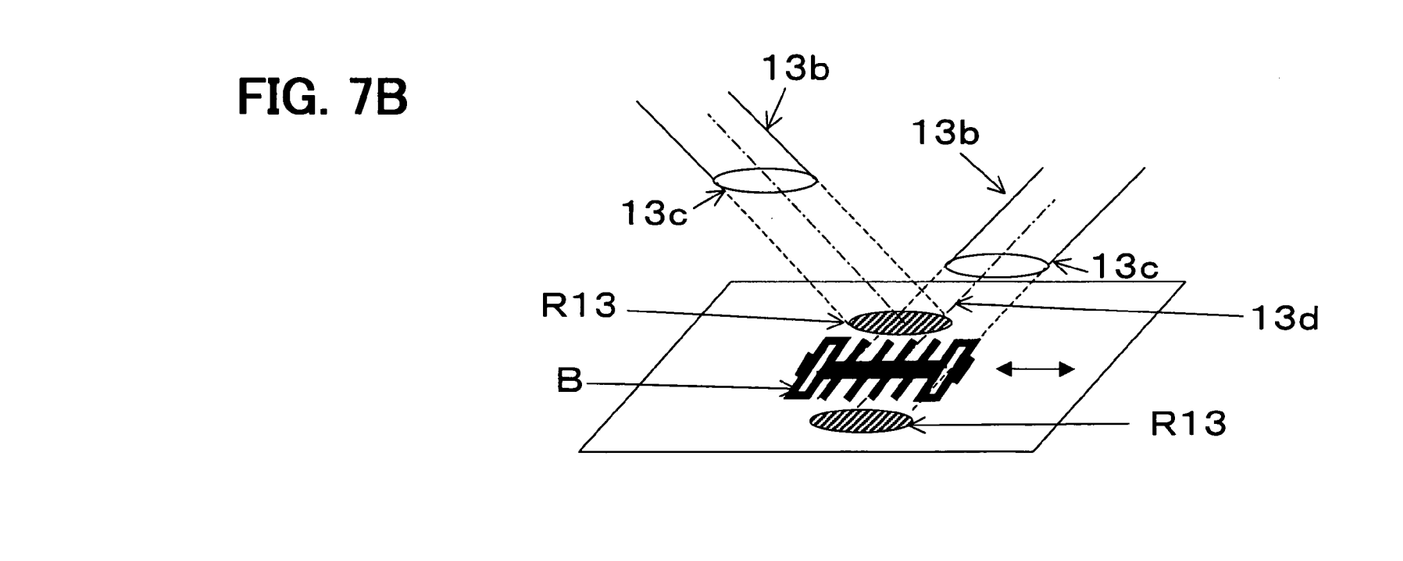

In more detail, as shown FIGS. 7A and 7B, the communication passage 13b is provided so that a projection R13 of an outlet 13c of the communication passage 13b on the plane of the sensor along a center line 13d is placed at a different area than an area where a movable portion of an acceleration sensor is formed. In FIG. 7A, the communication hole 13b and its outlet 13c are provided so that the projection R13 locates at both side of the movable portion B of the sensor along a direction parallel to a movement of the movable portion B (see arrow in FIG. 7A). On the contrary, the communication hole 13b and its outlet 13c are provided so that the projection R13 locates at both side of the movable portion B of the sensor along a direction perpendicular to a movement of the movable portion B.

Figure 2A:
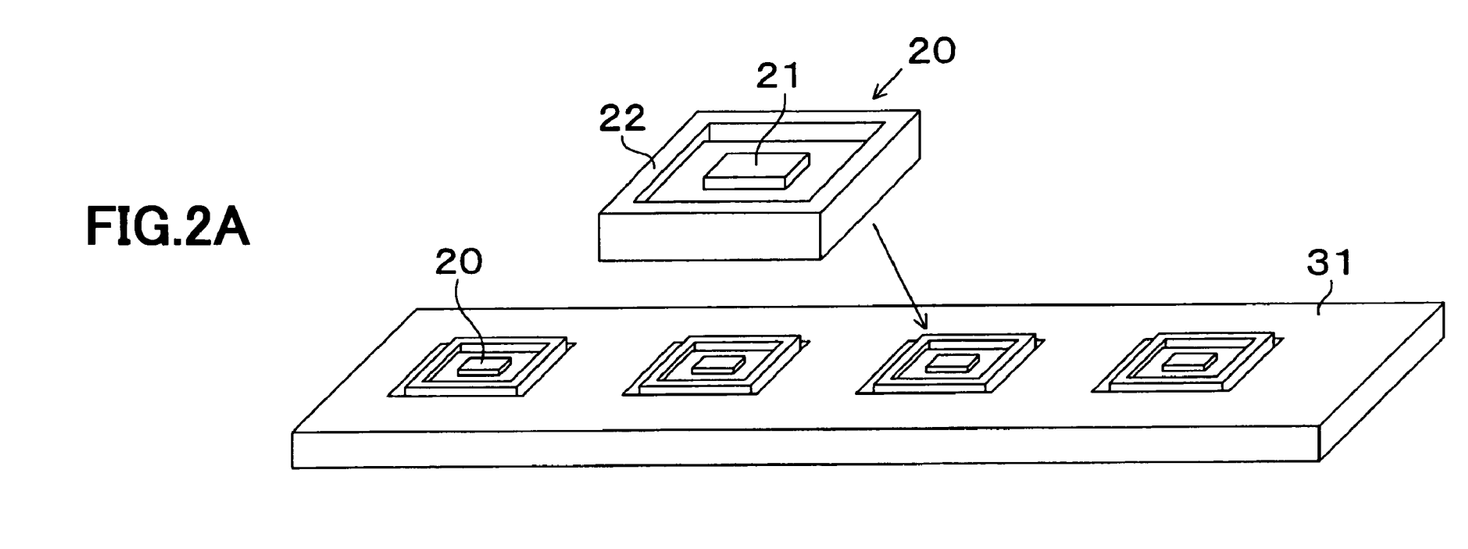
FIGS. 2A and 2B are components of the foreign particle removal system of FIG. 1 in more detail.
Figure 2B:
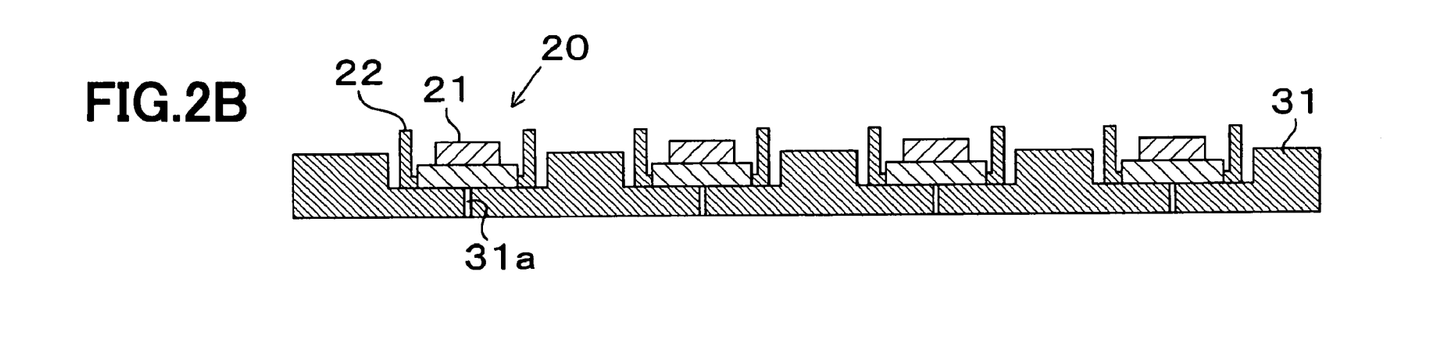

As shown in FIG. 2A and FIG. 2B, the transportation carrier 31 includes plural concave portions for holding the semiconductor devices 20. Through-hole passages 31a are formed in a depth wise direction in a bottom of each of the concave portions of the transportation carrier 31. Also as shown in FIG. 2A and FIG. 2B, each of the semiconductor devices 20 includes an acceleration sensor 21 and a seal package 22, with the acceleration sensor 21 being mounted on the inside of the package 22.

Although the transportation carrier 31 is shown as holding four semiconductor devices 20, the number of the semiconductor devices 20 held by the transportation carrier 31 is not limited to any particular number.

An exemplary method of removing foreign particles adhered to the semiconductor devices 20 by using the system 10 will be described. At first, as shown in FIG. 2A, each one of the semiconductor devices 20 is placed in a concave portion of the transportation carrier 31. Next, as shown in FIG. 1, the transportation carrier 31 is mounted on the vacuum chuck 11b of the vibration table 11a.

Successively, the valve 14 for the vacuum chuck 11b is operated under pressure of the exhaust pump 16 through the vacuum chuck 11b, and a vacuum is created through the through-hole passage 31a (as shown in FIG. 2B) of the transportation carrier 31. Therefore, a bottom surface of each of the semiconductor devices 20 is affixed on the vibration table 11a.

As shown in FIG. 3, the semiconductor devices 20 are then vibrated by the vibration table 11a during a system vibration mode. The vibrating of the semiconductor devices 20 separates the foreign particles adhered to the surface of the semiconductor devices 20. It is preferable that the vibration table 11a vibrates the semiconductor devices 20 in a direction that is parallel (horizontal) to a board surface of the semiconductor devices 20. The vibration in this horizontal direction can more effectively separate the foreign particles adhered to the surface of the semiconductor devices 20, as the power generated by the vibration in the horizontal direction does not force foreign particles onto the surface of the semiconductor devices 20. The vibration frequency of the vibration table 11a is preferable equal to or less than 1 kHz. This low frequency avoids a movable portion of the acceleration sensor 21 from vibrating at its resonance frequency.

Figure 4:
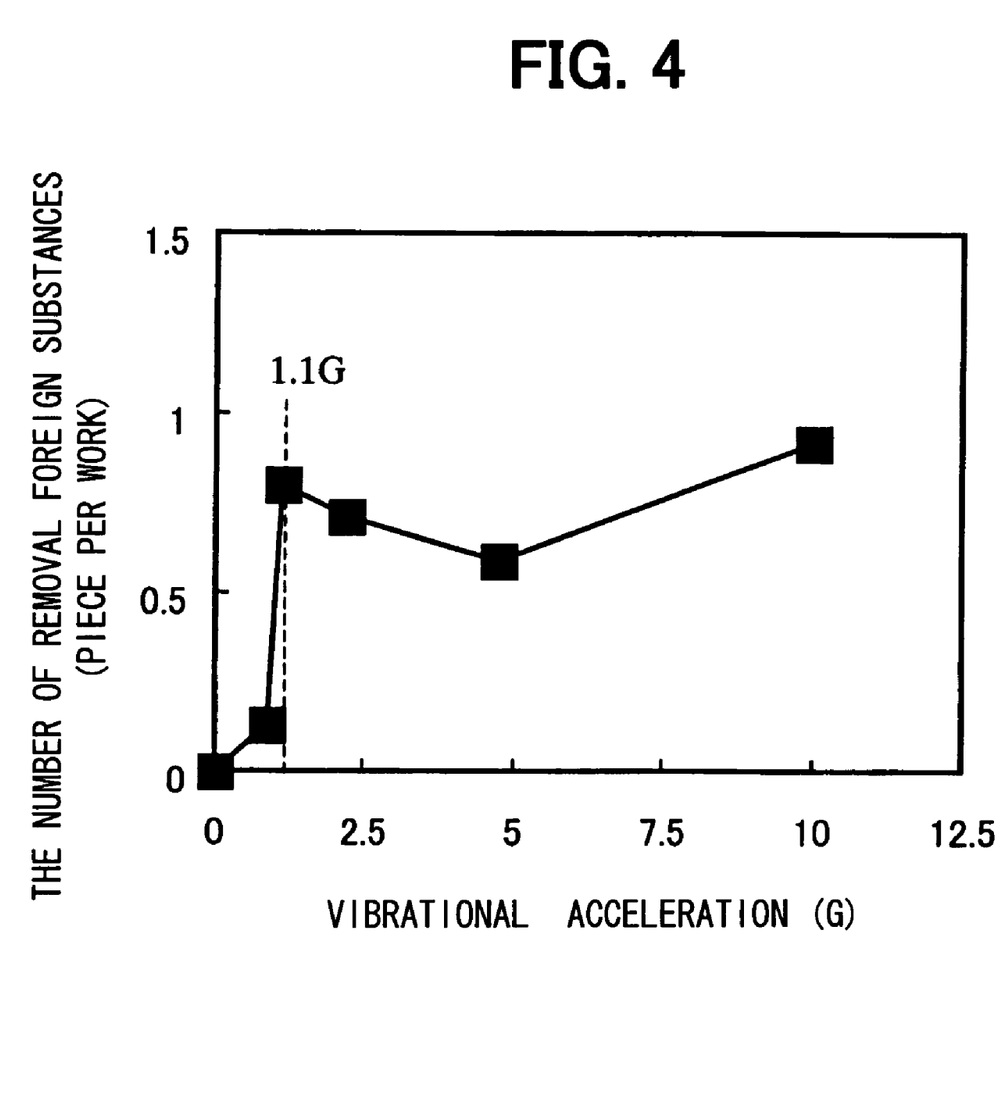
FIG. 4 is a graph showing a relationship between vibration and foreign particle removal of the foreign particle removal system.

When the strength of the vibration is defined as vibration acceleration. FIG. 4 shows a relation between vibration acceleration and the number of the foreign particles larger than 2 μm that removed from each semiconductor device (workpiece). As shown in FIG. 4, the number of removed foreign particles increases rapidly when the vibrational acceleration is equal to or more than 1.1 G. Therefore, vibration acceleration equal to or more than 1.1 G is preferable.

After the vibration table 11a is vibrated for a predetermined time selected from 0.1-1000 sec, preferably 1-10 sec., the vibration is stopped. The valve 14 for the vacuum chuck 11b is operated and the vacuum created by the vacuum chuck 11b to hold the semiconductor devices 20 in place is removed.

Next, as shown in FIG. 5, the suction device 12 suctions and removes the foreign particles now separated from the surfaces of the semiconductor devices 20 by the vibration device 11 during a system suction mode. A suction process occurs simultaneously for each of the semiconductor devices 20. At first the suction device 12 is lowered close to the semiconductor devices 20 so that the distance between the top surface of the sealing package 22 of the semiconductor devices 20 and a lower surface of the suction interface 13 of the suction device 12 is around 0.1 mm-0.5 mm.

The top surface of the sealed package 22 and a lower surface of the suction interface 13 of the suction device 12 form a space 23 without touching. Here, a vacuum passage 13a is located directly above each of the acceleration (G) sensors 21.

The suction valve 15 is then operated. As a result, the vacuum passage 13a and the exhaust pump 16 are connected, and the valve 14 of the vacuum chuck 11b is operated to cut off a connection with the exhaust pump 16. The semiconductor devices 20 are drawn upwardly by a force generated by the vacuum passage 13a. The seal package 22 is suctioned to the suction interface 13 and is held to the suction interface 13 in the upper part of the transportation carrier 31. Because a lower part of the suction interface 13 does not contact the semiconductor devices 20, the sensors 21 of the semiconductor devices 20 are not damaged.

As shown in FIG. 5, when the semiconductor devices 20 are suctioned to the suction interface 13, the suction interface 13 covers an upper opening portion of the semiconductor devices 20, and a space 23 is defined between the semiconductor devices 20 and the suction interface 13.

The vacuum passage 13a and the communication passages 13b, 13b are in communication with the space 23. The space 23 is suctioned by the vacuum passage 13a and is decompressed. Fresh air is introduced into the space 23 and then is exhausted by the vacuum passage 13a to generate a current of air W which faces from the peripheral side to a central direction outside the semiconductor devices 20. The foreign particles separated by vibration during the system vibration mode are removed from the surfaces of the semiconductor devices 20 by the current of air W and are suctioned outside of the space 23 by the vacuum passage 13a. When the valve 15 is regulated so that the flow quantity of gas drained from the vacuum passage 13a reaches about around 3 liters a minute, the foreign particles can be removed efficiently.

As thus described, the space 23 formed between the semiconductor devices 20 and the suction interface 13 enables the foreign particles separated by the vibration device 12 from the semiconductor devices 20 to be removed by the current of air W generated in the space 23. Therefore, the foreign particles are not scattered out of the space 23. Furthermore, as it is not necessary that the system 10 include a device that sprays gas on the semiconductor devices 20, the number of system components required in the system 10 is reduced.

After the foreign particles are removed by the suction device 12, the suction valve 15 is operated, and suction through the vacuum passage 13a is stopped. The vacuum valve 14 is then operated, and the vacuum chuck 11b of the vibration table 11a is operated again. As a result, the semiconductor devices 20 are placed back on the transportation carrier 31.

The transportation carrier 31 is then transferred to a subsequent process and the foreign particle removal processing is finished. As noted above, processing time per each of the semiconductor devices 20 for removing foreign particles can be reduced by placing plural semiconductor devices 20 on the transportation carrier 31.

Although the system 10 is described above as removing foreign particles from the semiconductor devices 20 having semiconductor acceleration sensors 21 mounted in ceramic packages, the system 10 is also applicable to removal of foreign particles on a semiconductor element before it is mounted in the package or to removal of foreign particles of other semiconductor devices such as ultrasonic sensors.

In addition, in the present exemplary embodiment, several semiconductor devices 20 were vibrated on the vibration device 11 at the same time and were suctioned by the suction device 12 at the same time. However, after several semiconductor devices 20 were vibrated by the vibration device 11 at the same time, the suction device 12 may alternatively remove the foreign particles of the semiconductor devices 20 one device at a time.

Further, the suction device 12 may alternatively be placed at the lower part of the vibration device 11 and the semiconductor devices 20 held downwardly while the foreign particles are removed.

In summary, the vibration device 11 separates the foreign particles from the semiconductor devices 20, the suction interface 13 of the suction device 12 covers the opening portion of the semiconductor devices 20, the space 23 connected with the vacuum passage 13a and the communication passage 13b is formed between the semiconductor devices 20 and the suction interface 13, the suction device 12 suctions the space 23, fresh air is introduced into the space 23 through the communication passages 13b, the current of air W is generated from the communication passages 13b to the vacuum passage 13a and the foreign particles are separated by the current of air W and are suctioned and removed through the vacuum passage 13a.

Because the separated foreign particles are carried out of the space 23 by the current of air W, the foreign particles are not scattered circumferentially and do not pollute the processing equipment and other clean semiconductor devices.

In addition, the system 10 need not include a device to spray gas onto the semiconductor device to generate the current of air W (as the foreign particles are removed from the space 23 by the suction device 12).

In addition, because the opening portions of the semiconductor devices 20 and the suction interface 13 of the suction device 12 form the space 23, it is not necessary to provide a cover for preventing scattering of the foreign particles. In other words, the system 10 can remove the foreign particles adhered to the semiconductor devices 20 effectively without the need to increase the number of system components.

Because parallel vibration in a plane surface of the semiconductor devices 20 can be introduced to the semiconductor devices 20 by the vibration device 11, the foreign particles are not pushed into the surface of the semiconductor devices 20 as would be the case if the vibration was orthogonal to the plane of the semiconductor devices 20. But in the embodiment, parallel vibration in a plane surface of the semiconductor devices 20 is added by the vibration device 11, the foreign particles are not pushed to the semiconductor devices 20.

Therefore the foreign particles can be separated more effectively from the surface of the semiconductor devices 20 by low frequency vibration.

The suction device 12 covers and suctions the opening portion of the semiconductor devices 20 without being in contact with the semiconductor devices 20. The suction device 12 suctions the semiconductor devices 20 and the space 23 can be formed between the semiconductor devices 20 and the suction device 12. Because the suction interface 13 does not load to, or in other words does not contact, the semiconductor devices 20 when the space 23 is formed, potential damage to the semiconductor devices 20 is avoided.

Therefore, a processing time for removing the foreign particles per each of the semiconductor devices 20 can be shortened and processing efficiency can be improved.

Figure 6:
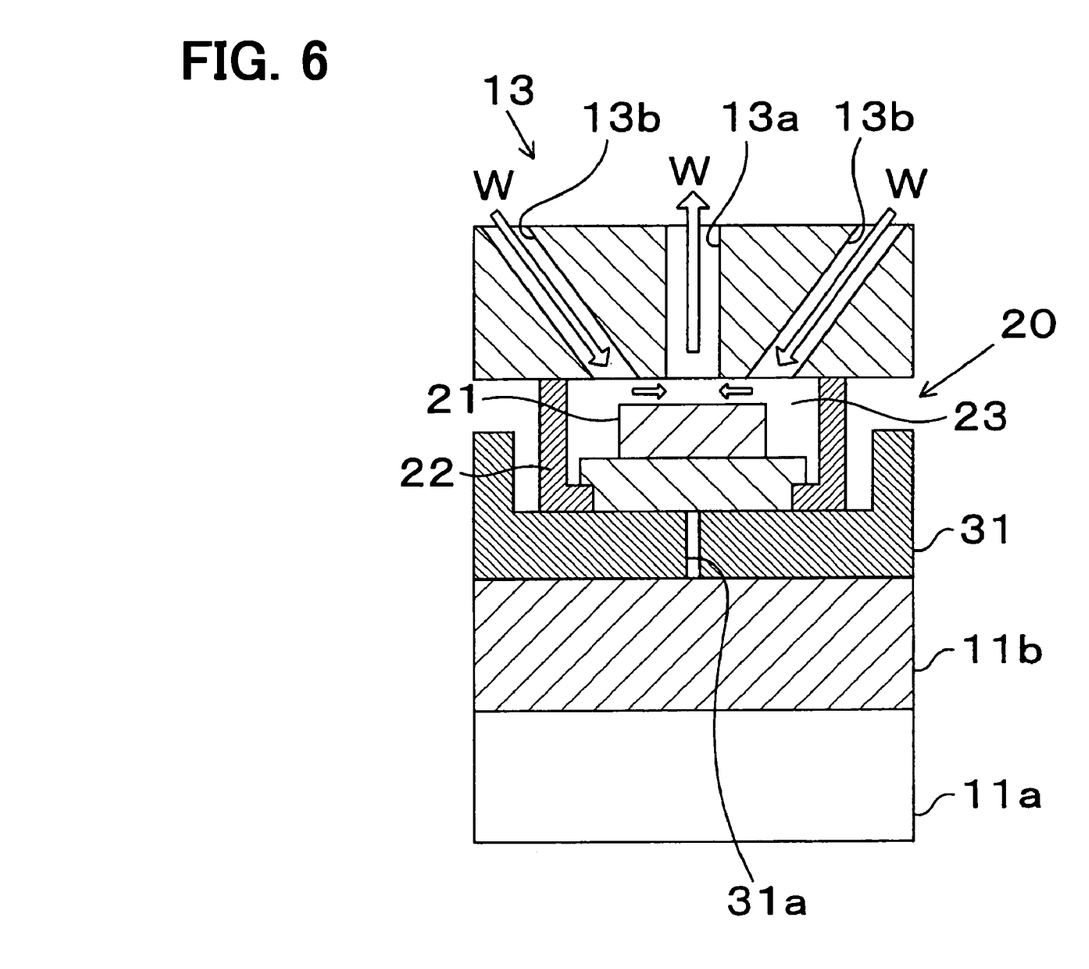
FIG. 6 shows operation of the foreign particle removal system according to an alternative exemplary embodiment.

FIG. 6, shows an alternative exemplary embodiment including a suction process where foreign particles may be removed as semiconductor devices 20 are suctioned by the vacuum chuck 11b and are fixed without intercepting the connection between the vacuum chuck 11b and the exhaust pump 16. In this exemplary embodiment, a change in operation of the valve 14 for the vacuum chuck 11b can be omitted.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system for removing foreign particles from a semiconductor device, comprising;
    a vibration device configured to vibrate the semiconductor device to separate the foreign particles from the surface of the semiconductor device;
    a suction device configured to cover the semiconductor device to hold the semiconductor device and to define a space between the suction device and the semiconductor device, and configured to suction foreign particles separated from the semiconductor device by the vibration device while a part of the semiconductor device is held next to the suction device; and
    an exhaust pump configured to create a vacuum in the space between the suction device and the semiconductor device, wherein
    the suction device further includes a communication passage connected to a fresh air source and a vacuum passage connected to the exhaust pump so that the communication passage and the vacuum passage generate a current of air from the communication passage through the space to the vacuum passage to remove the foreign particles separated from the semiconductor device.

* * * * *